United States Patent
Chiu et al.

(10) Patent No.: US 8,437,178 B2
(45) Date of Patent: May 7, 2013

(54) STATIC RANDOM ACCESS MEMORY CELL AND METHOD OF OPERATING THE SAME

(75) Inventors: Yi-Te Chiu, Kaohsiung (TW);
Ming-Hung Chang, Tainan (TW);
Hao-I Yang, Taipei (TW); Wei Hwang, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 127 days.

(21) Appl. No.: 13/096,796

(22) Filed: Apr. 28, 2011

(65) Prior Publication Data

US 2012/0230086 A1 Sep. 13, 2012

(30) Foreign Application Priority Data

Mar. 8, 2011 (TW) .............................. 100107824 A

(51) Int. Cl.
*G11C 11/00* (2006.01)
(52) U.S. Cl.
USPC .......................................... 365/156; 365/154
(58) Field of Classification Search ................... 365/156
See application file for complete search history.

(56) References Cited

U.S. PATENT DOCUMENTS

| | | | | |
|---|---|---|---|---|
| 7,277,348 B2* | 10/2007 | Peng et al. | ................. | 365/225.7 |
| 7,307,907 B2* | 12/2007 | Houston | ....................... | 365/222 |
| 7,385,840 B2 | 6/2008 | Redwine | | |
| 7,706,174 B2* | 4/2010 | Pradhan et al. | ................ | 365/156 |
| 8,164,943 B2* | 4/2012 | Sachdev et al. | ................ | 365/154 |
| 2012/0113708 A1* | 5/2012 | Jung et al. | ....................... | 365/154 |
| 2012/0120717 A1* | 5/2012 | Sekigawa et al. | ............. | 365/156 |
| 2012/0195111 A1* | 8/2012 | Ramaraju | ..................... | 365/156 |

OTHER PUBLICATIONS

Chang et al., "A 32 kb 10T Sub-Threshold SRAM Array with Bit-Interleaving and Differential Read Scheme in 90nm CMOS", IEEE Journal of Solid-State Circuits, vol. 44, No. 2, Feb. 1, 2009, pp. 650-658.
Chang et al., "An 8T-SRAM for Variability Tolerance and Low-Voltage Operation in High-Performance Caches", IEEE Journal of Solid-State Circuits, vol. 43, No. 4, Apr. 1, 2008, pp. 956-963.

* cited by examiner

*Primary Examiner* — Son Mai
(74) *Attorney, Agent, or Firm* — Haverstock & Owens LLP

(57) ABSTRACT

A static random access memory cell includes a latch unit. The latch unit includes a bi-inverting circuit and a switching circuit. The bi-inverting circuit has a first terminal and a second terminal. The switching circuit is electrically connected between the first terminal and the second terminal, wherein when the switching circuit is turned on, the switching circuit forms a feedback between the first terminal and the second terminal for latching the latch unit; and when the switching circuit is turned off, the feedback is removed to cause the SRAM cell to write a data bit to the latch unit.

16 Claims, 5 Drawing Sheets

STATIC RANDOM ACCESS MEMORY CELL AND METHOD OF OPERATING THE SAME

CROSS-REFERENCES TO RELATED APPLICATIONS

This application claims the benefit of Taiwan Patent Application No. 100107824, filed on Mar. 8, 2011, in the Taiwan Intellectual Property Office, the disclosures of which are incorporated herein in their entirety by reference.

FIELD OF THE INVENTION

The present invention relates to a static random access memory (SRAM) cell and a method of operating the same, and more particularly to single-port subthreshold SRAM cell having enhanced write ability and a method of operating the same.

BACKGROUND OF THE INVENTION

Each of the integrated circuit systems, involving the information, the communication, the biomedical and the consumer electronic products, and so forth, is developed towards the single chip system. The embedded memory is an indispensable portion of the single chip system, wherein it is the widest to use the SRAM therein, and the SRAM is applied to the temporary data storage and the data transmission.

The biomedical electronics is a quite popular field nowadays. It is unnecessary for the integrated circuit applied to the biomedical to operate in high speed, but it is necessary to operate for a long time, so that the integrated circuit must possess very low power consumption. Causing the circuit to be operated at the subthreshold voltage region provides an effective method to achieve ultra-low power consumption, but the reliability problem accompanied therewith will arrive. In particular, due to the process, the voltage and the temperature variations in the nanometer manufacturing process, the stability becomes the most important factor in the design consideration.

A technical scheme in the prior art disclosed in U.S. Pat. No. 7,385,840 B2 provides an SRAM cell with independent static noise margin, trip voltage, and read current optimization.

A technical scheme in the prior art is disclosed in Reference 1: J. Chang, J.-J. Kim. S. P. Park, and K. Roy, "A 32 kbit 10T subthreshold SRAM array with bitinterleaving and differential read-scheme in 90 nm CMOS", IEEE Journal of Solid-state Circuits, vol. 44, no. 2, Feb. 2009, pp. 650-658.

A technical scheme in the prior art is disclosed in Reference 2: Leland Chang, R. K. Montoye, Yutaka Nakamura, Kevin A. Batson, Richard J. Eickemeyer, Robert H. Dennard, Wilfried Haensch, and Damir Jamsek, "An 8T-SRAM for variability tolerance and low-voltage operation in high-performance caches", IEEE JSSC, April 2008, pp. 956-963.

SUMMARY OF THE INVENTION

It is an object of the present invention to provide an SRAM cell operated at the subthreshold voltage region. When operated at the subthreshold voltage region, the SRAM cell can still provide stable operation for suitability to be applied to the integrated circuit related to the biomedical.

It is another object of the present invention to provide an SRAM cell having a storage node. When the SRAM cell makes a write operation, a positive feedback of the storage node is cut off for enhancing the write ability thereof.

It is still another object of the present invention to provide an SRAM cell having a bit-interleaving architecture, there are benefits over the influence of the soft error under the bit-interleaving architecture so as to avoid the half-selected disturbance when reading or writing the SRAM cell.

It is still another object of the present invention to provide an SRAM cell including inverters for data storage. The inverters employ high-threshold-voltage components to enhance the data hold stability of the SRAM cell.

It is still another object of the present invention to provide an SRAM cell having a data storage node and a bitline. The read stability of the SRAM cell is increased by decoupling the data storage node with the bitline.

It is still another object of the present invention to provide an SRAM cell including read/write transistors. Each of the read/write transistors utilizes a reverse short channel effect for the SRAM cell to enhance the read/write ability and reduce the variation degree of the threshold voltage resulting from the manufacturing process.

It is still another object of the present invention to provide an SRAM cell having an architecture with a single ended read/write port. The SRAM cell utilizes the architecture to further lower the power consumption resulting from the longer length of the bitlines.

It is therefore an aspect of the present invention to provide an SRAM cell including a latch unit. The latch unit includes a bi-inverting circuit and a switching circuit. The bi-inverting circuit has a first terminal and a second terminal. The switching circuit is electrically connected between the first terminal and the second terminal, wherein when the switching circuit is turned on, the switching circuit forms a feedback between the first terminal and the second terminal for latching the latch unit; and when the switching circuit is turned off, the feedback is removed to cause the SRAM cell to write a data bit to the latch unit.

It is therefore another aspect of the present invention to provide a method of operating an SRAM cell including a bi-inverting circuit and a switching circuit, wherein the bi-inverting circuit has a first terminal and a second terminal, and the switching circuit is electrically connected between the first terminal and the second terminal. The method includes the following steps. A feedback is established between the first terminal and the second terminal for latching the bi-inverting circuit by controlling the switching circuit. Furthermore, the feedback is removed for loading a data bit into the bi-inverting circuit.

It is therefore still another aspect of the present invention to provide an SRAM cell including a bi-inverting circuit and a switching circuit. The bi-inverting circuit has a first terminal and a second terminal. The switching circuit is electrically connected between the first terminal and the second terminal for forming a first connection state therebetween, and changes the first connection state into a second connection state in response to an input signal.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 1:
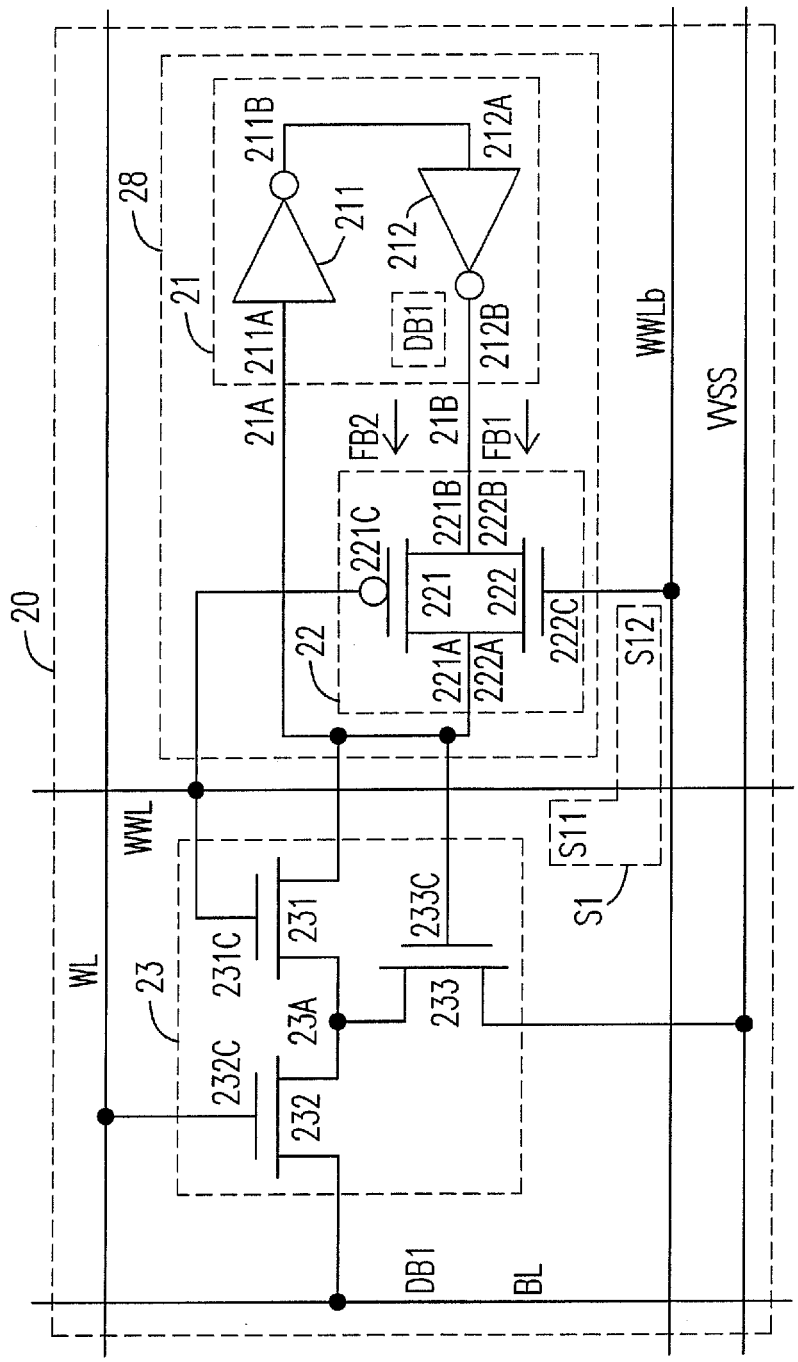
FIG. 1 is a schematic diagram showing a static random access memory (SRAM) cell according to one embodiment of the present invention.

Please refer to FIG. 1, which is a schematic diagram showing an SRAM cell 20 according to one embodiment of the present invention. As shown, the SRAM cell 20 includes a latch unit 28. The latch unit 28 includes a bi-inverting circuit 21 and a switching circuit 22. The switching circuit 22 is electrically connected to the bi-inverting circuit 21. In one embodiment, the bi-inverting circuit 21 has a first terminal 21A and a second terminal 21B. The switching circuit 22 is electrically connected between the first terminal 21A and the second terminal 21B. Furthermore, when the switching circuit 22 is turned on, the switching circuit 22 forms a feedback FB1 between the first terminal 21A and the second terminal 21B for latching the latch unit 28. When the switching circuit 22 is turned off, the feedback FB1 is removed to cause the SRAM cell 20 to write a data bit DB1 to the latch unit 28.

For instance, the SRAM cell 20 is a subthreshold circuit and includes a single read/write port. The SRAM cell 20 may utilize a reverse short channel effect. For instance, the feedback FB1 is a positive feedback, and the feedback FB1 has a direction from the second terminal 21B to the first terminal 21A. For instance, when the switching circuit 22 is turned off, the SRAM cell 20 writes the data bit DB 1 from the single read/write port to the latch unit 28.

In one embodiment, the bi-inverting circuit 21 includes an inverter 211 and an inverter 212. The inverter 212 is electrically connected to the inverter 211. The inverter 211 has an input terminal 211A and a storage node 211B. The inverter 212 has an input terminal 212A and a storage node 212B, and the input terminal 212A is electrically connected to the storage node 211B. For instance, the first terminal 21A of the bi-inverting circuit 21 is the input terminal 211A, and the second terminal 21B of the bi-inverting circuit 21 is the storage node 212B. For instance, the first terminal 21A serves as an access node, and the input terminal 212A only receives the output of the storage node 211B, so that the SRAM cell 20 has the single read/write port.

In one embodiment, the switching circuit 22 includes a pass transistor 221 and a pass transistor 222. The pass transistor 222 is electrically connected to the pass transistor 221. The pass transistor 221 is connected with the bi-inverting circuit 21 in parallel, and has a first terminal 221A, a second terminal 221B, a control terminal 221C and a p-type conductivity. For instance, the pass transistor 221 further has a controlled path located between the first terminal 221A and the second terminal 221B. The pass transistor 222 is connected with the pass transistor 221 in parallel, and has a first terminal 222A, a second terminal 222B, a control terminal 222C and an n-type conductivity, wherein the first terminal 21A is electrically connected to the first terminal 221A and the first terminal 222A, and the second terminal 21B is electrically connected to the second terminal 221B and the second terminal 222B.

In one embodiment, the switching circuit 22 receives an input signal S1, is turned on or turned off according to the input signal S1 for establishing or removing the feedback FB1. The input signal S1 may include signals S11 and S12. For instance, the signal S11 is a column write wordline signal, and the signal S12 is a row write-bar wordline signal. For instance, the control terminal 221C receives the signal S11, and the control terminal 222C receives the signal S12.

As shown in FIG. 1, in one embodiment, the SRAM cell 20 includes the latch unit 28, an auxiliary circuit 23, three wordlines WL, WWL and WWLb, a bitline BL and a virtual common line VVSS, wherein the bitline BL is a single one in the SRAM cell 20 and serves as the single read/write port. The latch unit 28 includes the bi-inverting circuit 21 and the switching circuit 22, and is electrically connected to the auxiliary circuit 23 and the wordlines WWL and WWLb. For instance, the three wordlines WL, WWL and WWLb are a row wordline, a column write wordline and a row write-bar wordline, respectively, wherein the wordline WWL is electrically connected to the control terminal 221C and receives the signal S11, and the wordline WWLb is electrically connected to the control terminal 222C and receives the signal S12.

The auxiliary circuit 23 is used to control the latch unit 28, and is electrically connected to the first terminal 21A, the bitline BL, the wordline WL, the wordline WWL and the virtual common line VVSS. In one embodiment, the auxiliary circuit 23 includes a pass transistor 231, a pass transistor 232, a read buffer transistor 233 and a pass node 23A. The pass transistor 231 is electrically connected between the first terminal 21A and the pass node 23A, and has a control terminal 231C and an n-type conductivity, wherein the control terminal 231C is electrically connected to the wordline WWL.

The pass transistor 232 is electrically connected between the pass node 23A and the bitline BL, and has a control terminal 232C and an n-type conductivity, wherein the control terminal 232C is electrically connected to the wordline WL. The read buffer transistor 233 is electrically connected between the pass node 23A and the virtual common line VVSS, and has a control terminal 233C, wherein the control terminal 233C is electrically connected to the first terminal 21A.

In one embodiment, each of the pass transistor 231, the pass transistor 232 and the read buffer transistor 233 has a property associated with a reverse short channel effect, and has a channel length longer than the other transistors in the SRAM cell 20. The bi-inverting circuit 21 includes four transistors (shown in FIG. 2). Each of the pass transistors 221, 222, 231 and 232 has a first respective threshold voltage being a regular threshold voltage of the metal-oxide-semiconductor (MOS) field effect transistor. Each of the read buffer transistor 233 and the four transistors of the bi-inverting circuit 21 has a second respective threshold voltage being a high threshold voltage of the MOS field effect transistor. That is to say, the second respective threshold voltage is higher than the first respective threshold voltage.

The SRAM cell 20 can have a hold state, a read-selected state, a write-selected state, a read-half-selected state, a first write-half-selected state and a second write-half-selected state respectively in different periods. When the SRAM cell 20 is in the write-selected state, the pass transistors 221 and 222 are turned off for turning off the switching circuit 22 and the pass transistors 231 and 232 are turned on for writing the data bit DB1 on the bitline BL to the latch unit 28. When the SRAM cell 20 is converted into another state in the above-mentioned states from the write-selected state, the switching circuit 22 is turned on and the bi-inverting circuit 21 holds the data bit DB1. When the SRAM cell 20 is in the read-selected state, the pass transistors 221, 222 and 232 are turned on and the pass transistor 231 is turned off for reading the data bit DB1 in the latch unit 28 under a condition that the bitline BL is decoupled with the first terminal 21A.

In one embodiment, the feedback FB1 is established when the SRAM cell 20 is configured in one selected from a group consisting of the hold, the read-selected, the read-half-selected, the first write-half-selected and the second write-half-selected states. The feedback FB1 is removed by controlling the switching circuit 22 when the SRAM cell 20 is configured in the write-selected state. For instance, the pass transistors 221 and 222 respond to the signals S11 and S12, respectively, so that the latch unit 28 is applied to the hold, the read-selected, the write-selected, the read-half-selected, the first write-half-selected and the second write-half-selected states respectively in the different periods.

In one embodiment implemented according to FIG. 1, the SRAM cell 20 includes a bi-inverting circuit 21 and a switching circuit 22. The switching circuit 22 is electrically connected to the bi-inverting circuit 21. The bi-inverting circuit 21 has a first terminal 21A and a second terminal 21B. The switching circuit 22 is electrically connected between the first terminal 21A and the second terminal 21B for forming a first connection state between the first terminal 21A and the second terminal 21B, and changes the first connection state into a second connection state therebetween in response to an input signal S1. For instance, the first connection state is one of a turn-on state and a turn-off state, and the first connection state inversely correlates with the second connection state in the on-off state. In one embodiment, when the switching circuit 22 responds to the input signal S1 to cause the first connection state to be configured to be the turn-on state, the switching circuit 22 forms a feedback FB1 between the first terminal 21A and the second terminal 21B for latching the bi-inverting circuit 21. When the switching circuit 22 responds to the input signal S1 to cause the first connection state to be changed into the second connection state being the turn-off state, the feedback FB1 is removed.

In one implementation, the first connection state is a turn-off state, and the second connection state is a turn-on state; when the first connection state is formed, the SRAM cell 20 loads a data bit DB1 into the bi-inverting circuit 21; and when the second connection state is formed, a feedback FB2 is formed between the first terminal 21A and the second terminal 21B for holding the data bit DB1 in the hi-inverting circuit 21. In one implementation, the first connection state is a turn-on state, and the second connection state is a turn-off state; when the first connection state is formed, a feedback FB1 is formed between the first terminal 21A and the second terminal 21B and the bi-inverting circuit 21 is latched through the feedback FB1; and when the second connection state is formed, the feedback FB1 is removed to cause the SRAM cell 20 to load a data bit DB1 into the bi-inverting circuit 21.

In one embodiment, the design of the SRAM cell 20 employs the multiple-threshold complementary metal-oxide-semiconductor (MTCMOS) design. The MTCMOS design brings benefits of reducing leakage and increasing the write margin (WM)/static noise margin (SNM). The reverse short channel effect is utilized in the pass transistor 231, the pass transistor 232 and the read buffer transistor 233. A little area penalty is introduced when designed to operate in the sub-threshold region, and the usage of longer channel length lessons the variation of the subthreshold voltage region and improves the on-off current ratio, thereby leading to higher performance.

In one embodiment, each of the constituent transistors of the SRAM cell 20 is operated in the subthreshold region of the MOS transistor, so that the SRAM cell 20 forms a subthreshold circuit and is operated at the subthreshold voltage region. The SRAM cell 20 has a single read/write port and a property associated with the reverse short channel effect. The storage node 212B of the latch unit 28 is decoupled with the bitline BL in the read-selected state. The positive feedback from the storage node 212B of the latch unit 28 is cut off in the write-selected state. When the SRAM cell 20 is operated in the subthreshold region, the SRAM cell 20 can keep the stabilities in the hold state and the read-selected state, and improves the write ability thereof.

The reverse short channel effect is applied to the pass transistor 231, the pass transistor 232 and the read buffer transistor 233, so that each of them has a lowered threshold voltage and a reduced leakage current, thereby improving the read/write ability thereof and reducing the variation degree of the threshold voltage resulting from the manufacturing process. The storage node 212B of the latch unit 28 is decoupled with the bitline BL in the read-selected state, so that the storage node 211B or the storage node 212B is not disturbed by a signal on the bitline BL, thereby enhancing the anti-noise ability during reading. The positive feedback from the storage node 212B of the latch unit 28 is cut off in the write-selected state so as to enhance the write ability by a large margin. The single ended read/write architecture of the SRAM cell 20 can have the reduced number of the bitline so as to lower the power consumption resulting from the bitlines.

In one embodiment implemented according to FIG. 1, a method of operating the SRAM cell 20 includes the following steps. A feedback FB1 is established between the first terminal 21A and the second terminal 21B of the bi-inverting circuit 21 for latching the bi-inverting circuit 21 by controlling the switching circuit 22. Furthermore, the feedback FB1 is removed for loading a data bit DB1 into the bi-inverting circuit 21.

Figure 2:
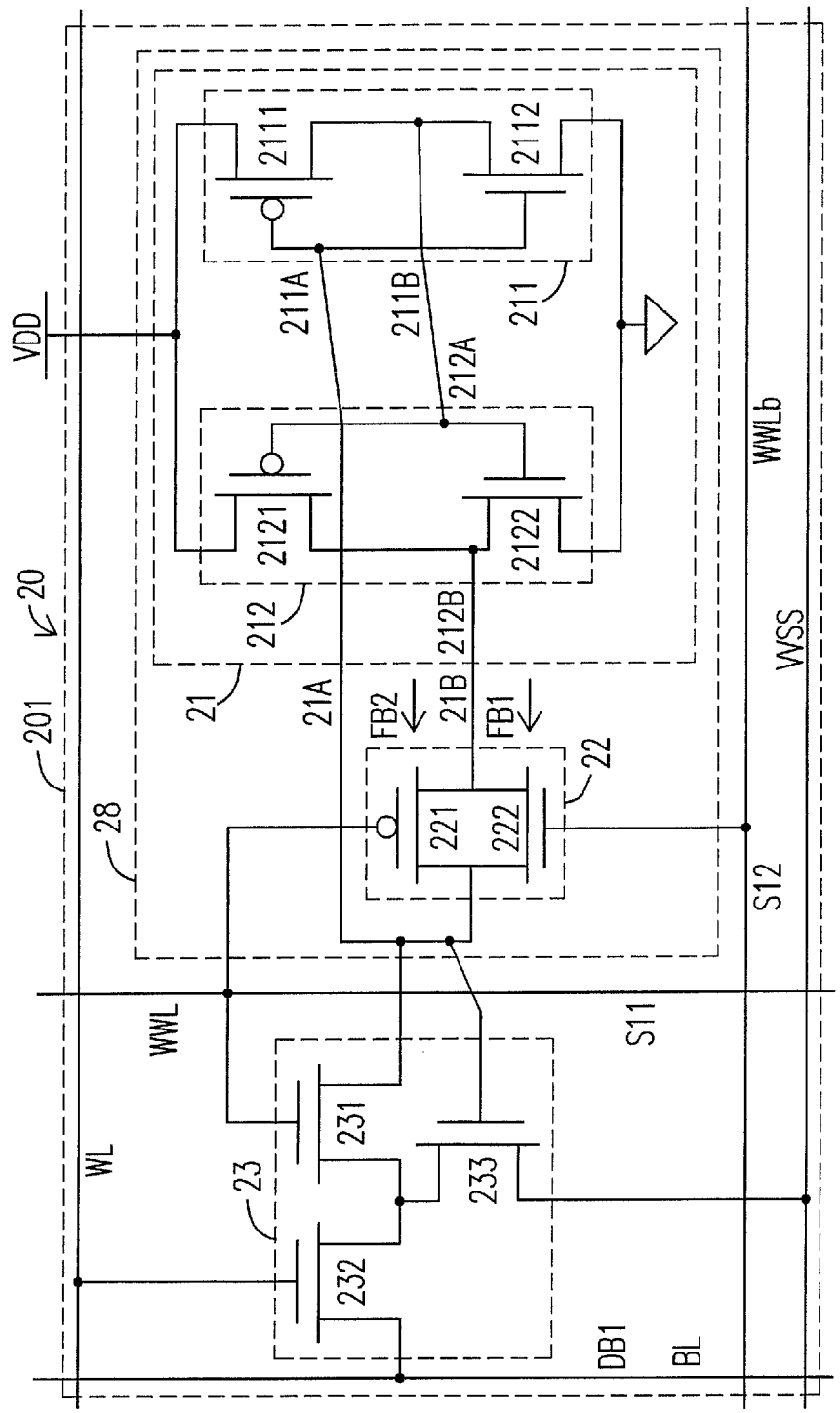
FIG. 2 is a schematic diagram showing a configuration of the SRAM cell according to one embodiment of the present invention.

Please refer to FIG. 2, which is a schematic diagram showing a configuration 201 of the SRAM cell 20 according to one embodiment of the present invention. Compared with FIG. 1, FIG. 2 shows the detailed structure of the latch unit 28, the components having the same reference numeral possess the same name and function in FIGS. 1 and 2. In FIG. 2, the configuration 201 of the SRAM cell 20 includes the latch unit 28, the auxiliary circuit 23, the wordlines WL, WWL and WWLb, the single bitline BL and the virtual common line VVSS. The latch unit 28 includes the bi-inverting circuit 21 and the switching circuit 22, and the bi-inverting circuit 21 includes the inverters 211 and 212. The inverter 211 includes a pull-up transistor 2111 and a pull-down transistor 2112, and the inverter 212 includes a pull-up transistor 2121 and a pull-down transistor 2122. The connection relation among the pull-up transistor 2111, the pull-down transistor 2112, the pull-up transistor 2121 and the pull-down transistor 2122 are shown in FIG. 2. Each of the inverters 211 and 212 receives a supply voltage VDD. The size of the supply voltage VDD causes each transistor in the SRAM cell 20 to be operated in the subthreshold region.

Figure 3:
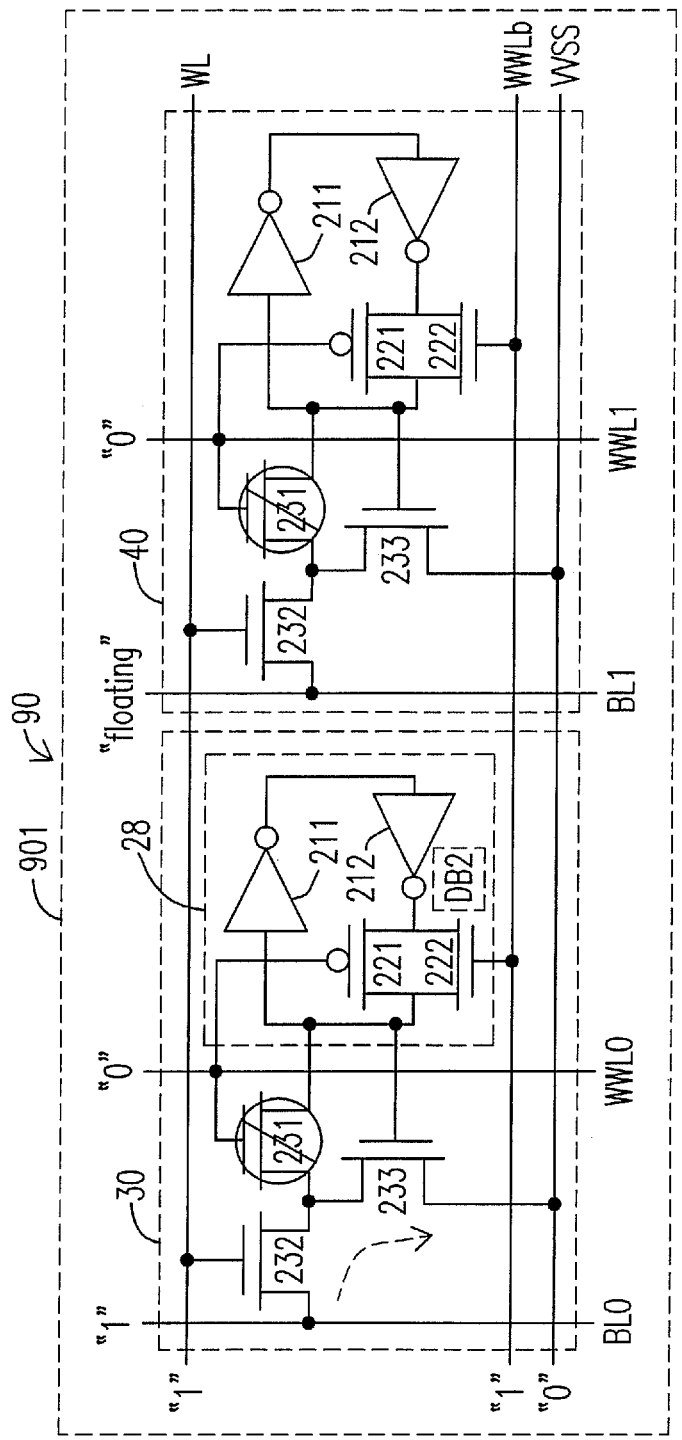
FIG. 3 is a schematic diagram showing a configuration of an SRAM array in a read mode according to one embodiment of the present invention.

Please refer to FIG. 3, which is a schematic diagram showing a configuration 901 of an SRAM array 90 in a read mode according to one embodiment of the present invention. As shown, the configuration 901 of the SRAM array 90 includes a row of SRAM cells, the row of SRAM cells includes SRAM cells 30 and 40, and the SRAM cell 30 is adjacent to the SRAM cell 40. The SRAM array 90 has a read mode. When the SRAM array 90 is in the read mode, the latch unit 28 of the SRAM cell 30 has a data bit DB2, and the SRAM cells 30 and 40 are configured into a read-selected state and a read-half-selected state, respectively, so as to read the data bit DB2 from the latch unit 28 of the SRAM cell 30 to the bitline BL1.

In FIG. 3, a state "1" represents a high voltage level state, and a state "0" represents a low voltage level state. When the SRAM array 90 is in the read mode, the voltage levels of the wordlines WL and WWLb are configured to be in the states "1" and "1", respectively, and the voltage level of the virtual common line VVSS is configured to be in the state "0". Furthermore, the bitline BL0 is pre-charged to the state "1", and the voltage levels of the wordline WWL0, the bitline BL1 and the wordline WWL1 are configured to be in the state "0", the state "floating" and the state "0", respectively.

When being in the read mode, each of the pass transistor 231 of the SRAM cell 30 and the pass transistor 231 of the SRAM cell 40 is turned off so as to isolate the data storage nodes thereof from the disturbance noise.

Figure 4:
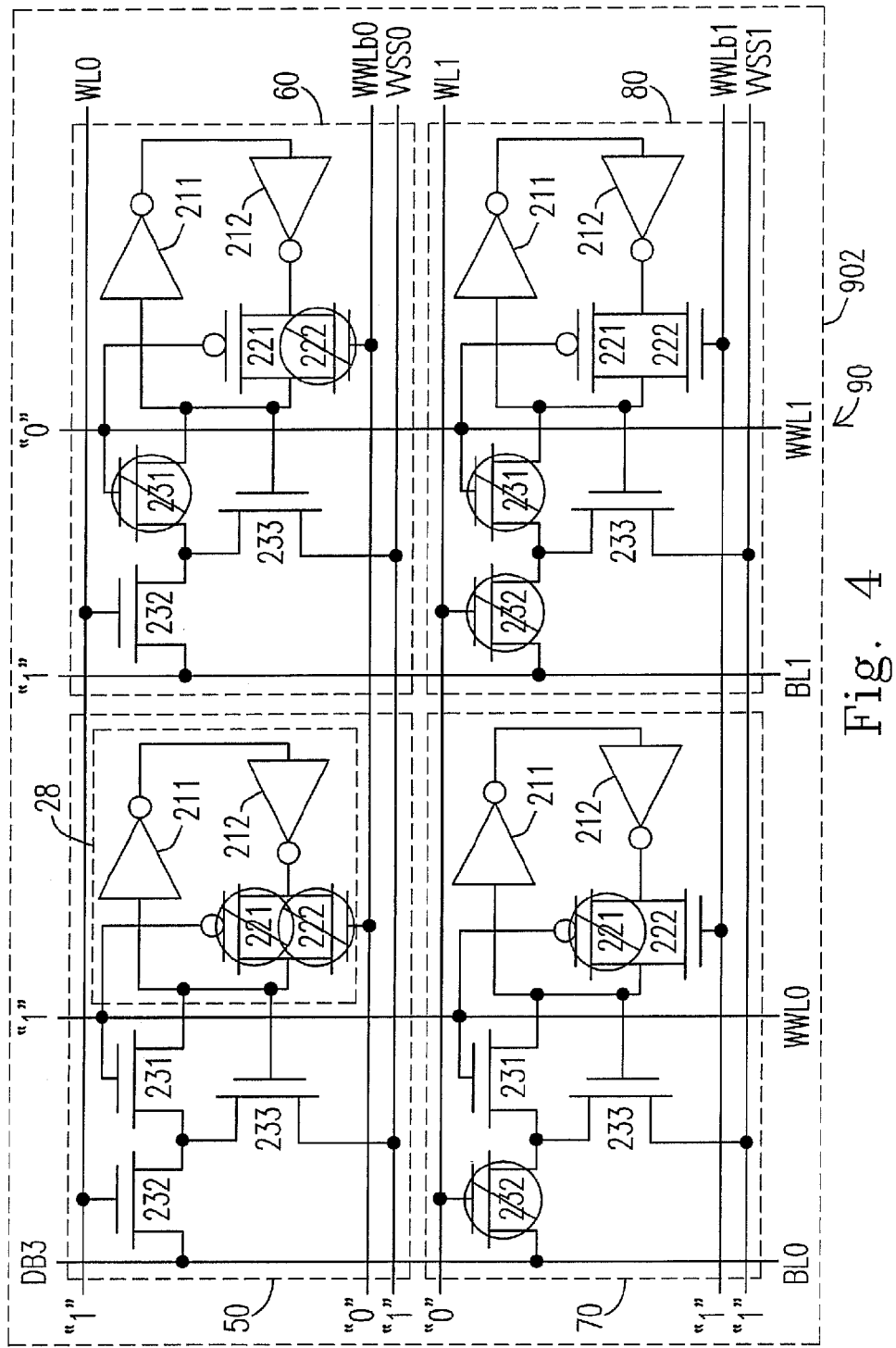
FIG. 4 is a schematic diagram showing a configuration of an SRAM array in a write mode according to one embodiment of the present invention.

Please refer to FIG. 4, which is a schematic diagram showing a configuration 902 of the SRAM array 90 in a write mode according to one embodiment of the present invention. As shown, the configuration 902 of the SRAM array 90 includes SRAM cells 50, 60, 70 and 80, a first row, a second row adjacent to the first row, a first column and a second column adjacent to the first column. The SRAM cells 50 and 60 are mutually adjacent and are arranged in the first row, and the SRAM cells 70 and 80 are mutually adjacent and are arranged in the second row. The SRAM cells 50 and 70 are mutually adjacent and are arranged in the first column, and the SRAM cells 60 and 80 are mutually adjacent and are arranged in the second column. When the SRAM array 90 is in the write mode, the SRAM cells 50, 60, 70 and 80 are respectively configured to be in a write-selected state, a first write-half-selected state, a second write-half-selected state and a hold state so as to write a data bit DB3 on the bitline BL0 to the latch unit 28 of the SRAM cell 50.

In FIG. 4, when the SRAM array 90 is in the write mode, the voltage levels of the wordlines WL0, WWLb0, WL1, and WWLb1 are configured to be in the states "1", "0", "0" and "1", respectively, and each of the voltage levels of the virtual common lines VVSS0 and VVSS1 is configured to be in the state "1". Furthermore, the bitline BL0 receives the data bit DB3, and the voltage levels of the wordline WWL0, the bitline BL1 and the wordline WWL1 are configured to be in the state "1", the state "1" and the state "0", respectively. When being in the write mode, the positive feedback of the SRAM cell 50 is cut off by turning off the pass transistors 221 and 222 of the SRAM cell 50, thereby enhancing the write ability of the SRAM cell 50 in the write-selected state by a large margin.

Figure 5A:
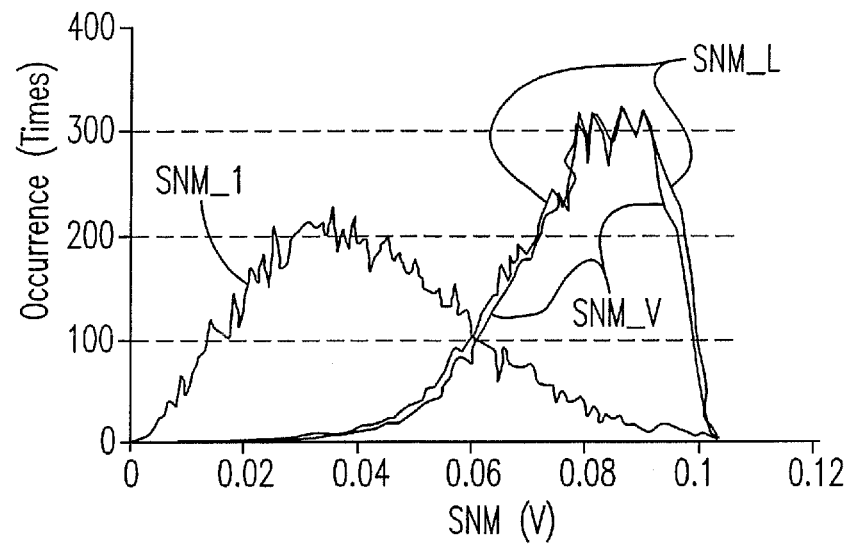
FIG. 5(a) is a schematic diagram showing static noise margin distributions of SRAM cells respectively in write-half-selected states provided in Reference 2 and FIG. 4 of the present invention.
Figure 5B:
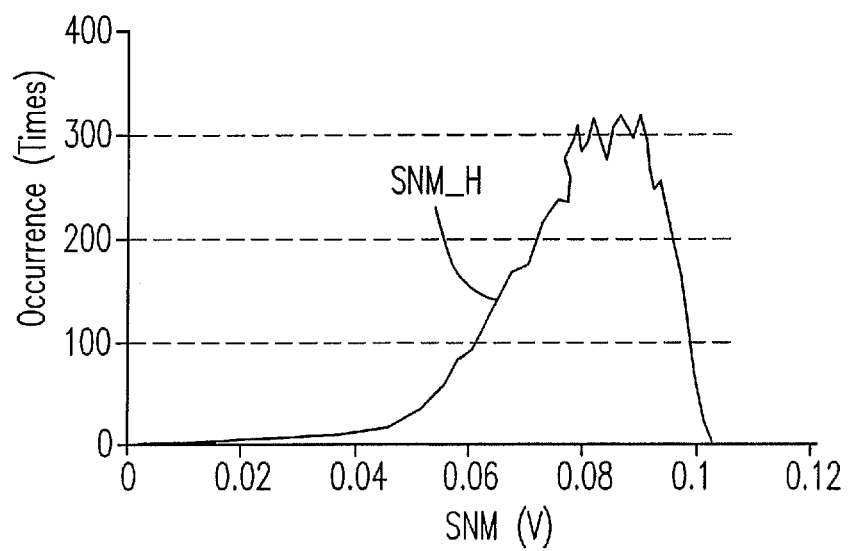
FIG. 5(b) is a schematic diagram showing a static noise margin distribution of the SRAM cell in a hold state provided in FIG. 4 of the present invention.

Please refer to FIG. 5(a), which is a schematic diagram showing static noise margin (SNM) distributions of SRAM cells respectively in write-half-selected states provided in Reference 2 and FIG. 4 of the present invention. FIG. 5(a) shows curves SNM_1, SNM_L and SNM_V. The curve SNM_1 indicates the SNM distribution of a 8T SRAM cell in the write-half-selected state provided according to Reference 2. Curves SNM_L and SNM_V indicate the SNM distributions of the SRAM cells 60 and 70 respectively in the first and the second write-half-selected state provided according to FIG. 4 of the present invention. Please refer to FIG. 5(b), which is a schematic diagram showing a SNM distribution of the SRAM cell in a hold state provided according to FIG. 4 of the present invention. In FIG. 5(b), the curve SNM_H indicates the SNM distribution in the hold state of the SRAM cells 80 provided according to FIG. 4 of the present invention.

As shown in FIG. 5(a) and FIG. 5(b), when the SRAM array 90 is operated in the write mode, the SRAM cells 50 is configured to be in the write-selected state, and each of the SNM distributions of the SRAM cells 60 and 70 respectively in the first and the second write-half-selected states is almost the same as the SNM distribution of the SRAM cells 80 in the hold state. In each of the SRAM cells 60 and 70, each of the pass transistors 221 and 222 has a regular threshold voltage. Although only one of the pass transistors 221 and 222 is turned on, the SNM distribution of each of the SRAM cells 60 and 70 is almost the same as that of the SRAM cells 80.

As shown in FIG. 5(a), due to the disturbance in the write-half-selected state of the 8T SRAM cell, the 8T SRAM cell provided in Reference 2 has a seriously worsened SNM distribution. As shown in FIG. 3, FIG. 4, FIG. 5(a) and FIG. 5(b), the SRAM array 90 utilizes the wordlines WWL0 and WWL1 to form a bit-interleaving structure, wherein the bit-interleaving structure has benefits over the influence of the soft error, and can avoid the half-selected disturbance when being in the read/write mode.

Embodiments

1. A static random access memory (SRAM) cell includes a latch unit. The latch unit includes a bi-inverting circuit and a switching circuit. The bi-inverting circuit has a first terminal and a second terminal. The switching circuit is electrically connected between the first terminal and the second terminal, wherein when the switching circuit is turned on, the switching circuit forms a feedback between the first terminal and the second terminal for latching the latch unit; and when the switching circuit is turned off, the feedback is removed to cause the SRAM cell to write a first data bit to the latch unit.

2. The SRAM cell according to the embodiment 1 is a subthreshold circuit, includes a single read/write port, and utilizes a reverse short channel effect.

3. The SRAM cell according to one of embodiments 1-2, wherein the bi-inverting circuit includes a first inverter and a second inverter. The first inverter has a first input terminal and a first storage node. The second inverter has a second storage node and a second input terminal electrically connected to the first storage node, wherein the feedback is a positive feedback, the first terminal is the first input terminal, and the second terminal is the second storage node.

4. The SRAM cell according to one of embodiments 1-3, wherein the switching circuit includes a first pass transistor and a second pass transistor. The first pass transistor is connected with the bi-inverting circuit in parallel, and has a first control terminal and a p-type conductivity. The second pass transistor is connected with the first pass transistor in parallel, and has a second control terminal and an n-type conductivity.

5. The SRAM cell according to one of embodiments 1-4 further includes a row wordline, a row write-bar wordline, a virtual common line, a single bitline, a column write wordline and an auxiliary circuit. The row write-bar wordline is electrically connected to the second control terminal. The column write wordline is electrically connected to the first control terminal. The auxiliary circuit is electrically connected to the latch unit, the single bitline, the row wordline, the column write wordline and the virtual common line for controlling the latch unit.

6. The SRAM cell according to one of embodiments 1-5, wherein the auxiliary circuit includes a pass node, a third pass transistor, a fourth pass transistor and a read buffer transistor. The third pass transistor is electrically connected between the first terminal and the pass node, and has an n-type conductivity and a third control terminal electrically connected to the column write wordline. The fourth pass transistor is electrically connected between the pass node and the single bitline, and has an n-type conductivity and a fourth control terminal electrically connected to the row wordline. The read buffer transistor is electrically connected between the pass node and the virtual common line, and has an n-type conductivity and a fifth control terminal electrically connected to the first terminal.

7. The SRAM cell according to one of embodiments 1-6, wherein each of the third pass, the fourth pass and the read buffer transistors has a property associated with a reverse short channel effect; each of the first, the second, the third and the fourth pass transistors has a first respective threshold voltage; the bi-inverting circuit includes four transistors; and each of the read buffer transistor and the four transistors of the bi-inverting circuit has a second respective threshold voltage higher than the first respective threshold voltage.

8. The SRAM cell according to one of embodiments 1-7, wherein the SRAM cell has a write-selected state and a read-selected state; when the SRAM cell is in the write-selected state, the first and the second pass transistors are turned off for turning off the switching circuit and the third and the fourth pass transistors are turned on for writing the first data bit on the single bitline to the latch unit; when the switching circuit is turned on, the bi-inverting circuit holds the first data bit; and when the SRAM cell is in the read-selected state, the first, the second and the fourth pass transistors are turned on and the third pass transistor is turned off for reading the first data bit in the latch unit under a condition that the single bitline is decoupled with the first terminal.

9. The SRAM cell according to one of embodiments 1-8 is arranged in a SRAM array, wherein the SRAM array utilizes the column write wordline to form a bit-interleaving structure.

10. A method of operating an SRAM cell including a bi-inverting circuit and a switching circuit, wherein the bi-inverting circuit has a first terminal and a second terminal, and the switching circuit is electrically connected between the first terminal and the second terminal. The method includes steps of: establishing a feedback between the first terminal and the second terminal for latching the bi-inverting circuit by controlling the switching circuit; and removing the feedback for loading a first data bit into the bi-inverting circuit.

11. The method according to embodiment 10, wherein the SRAM cell is a subthreshold circuit, and has a single read/write port.

12. The method according to one of embodiment 10-11, wherein wherein the SRAM cell further includes a latch unit including the bi-inverting circuit and the switching circuit, and the bi-inverting circuit includes a first inverter and a second inverter. The first inverter has a first input terminal and a first storage node. The second inverter has a second storage node and a second input terminal electrically connected to the first storage node, wherein the feedback is a positive feedback, the first terminal is the first input terminal, and the second terminal is the second storage node.

13. The method according to one of embodiment 10-12, wherein the switching circuit includes a first pass transistor and a second pass transistor. The first pass transistor is connected with the bi-inverting circuit in parallel, and has a first control terminal and a p-type conductivity. The second pass transistor is connected with the first pass transistor in parallel, and has a second control terminal and an n-type conductivity.

14. The method according to one of embodiment 10-13, wherein the SRAM cell further includes a column write wordline and a row write-bar wordline. The column write wordline is electrically connected to the first control terminal, and receives a first signal. The row write-bar wordline is electrically connected to the second control terminal, and receives a second signal.

15. The method according to one of embodiment 10-14, wherein the SRAM cell has a hold state, a read-selected state, a write-selected state, a read-half-selected state, a first write-half-selected state and a second write-half-selected state respectively in different periods; the feedback is established when the SRAM cell is configured in one selected from a group consisting of the hold, the read-selected, the read-half-selected, the first write-half-selected and the second write-half-selected states; and the feedback is removed by controlling the switching circuit when the SRAM cell is configured in the write-selected state.

16. The method according to one of embodiment 10-15 further includes a step of causing the latch unit to be applied to the hold, the read-selected, the write-selected, the read-half-selected, the first write-half-selected and the second write-half-selected states respectively in the different periods by means that, the first and the second pass transistors respectively respond to the first and the second signals.

17. An SRAM cell includes a bi-inverting circuit and a switching circuit. The bi-inverting circuit has a first terminal and a second terminal. The switching circuit is electrically connected between the first terminal and the second terminal for forming a first connection state therebetween, and changes the first connection state into a second connection state in response to an input signal.

18. The SRAM cell according to the embodiment 17 further includes a latch unit including the bi-inverting circuit and the switching circuit, wherein the first connection state is a turn-off state, and the second connection state is a turn-on state; when the first connection state is formed, the SRAM cell loads a first data bit into the bi-inverting circuit; and when the second connection state is formed, a feedback is formed between the first terminal and the second terminal for holding the first data bit in the bi-inverting circuit.

19. The SRAM cell according to one of embodiments 17-18, wherein the first connection state is a turn-on state, and the second connection state is a turn-off state.

20. The SRAM cell according to one of embodiments 17-19, wherein when the first connection state is formed, a feedback is formed between the first terminal and the second terminal and the bi-inverting circuit is latched through the feedback; and when the second connection state is formed, the feedback is removed to cause the SRAM cell to load a first data bit into the bi-inverting circuit.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:
1. A static random access memory cell, comprising:
a latch unit including:
a bi-inverting circuit having a first terminal and a second terminal; and a switching circuit electrically connected between the first terminal and the second terminal, and including a first pass transistor and a second pass transistor, wherein the first pass transistor is connected with the bi-inverting circuit in parallel and has a first control terminal and a p-type conductivity, and the second pass transistor is connected with the first pass transistor in parallel and has a second control terminal and an n-type conductivity;

a row wordline;

a row write-bar wordline electrically connected to the second control terminal;

a virtual common line:

a single bitline;

a column write wordline electrically connected to the first control terminal; and an auxiliary circuit electrically connected to the latch unit, the single bitline, the row wordline, the column write wordline and the virtual common line for controlling the latch unit, wherein:

when the switching circuit is turned on, the switching circuit forms a feedback between the first terminal and the second terminal for latching the latch unit; and when the switching circuit is turned off, the feedback is removed to cause the static random access memory cell to write a first data bit to the latch unit.

2. A static random access memory cell according to claim 1, being a subthreshold circuit, comprising a single read/write port, and utilizing a reverse short channel effect.

3. A static random access memory cell according to claim 1, wherein the bi-inverting circuit comprises:

a first inverter having a first input terminal and a first storage node; and a second inverter having a second storage node and a second input terminal electrically connected to the first storage node, wherein the feedback is a positive feedback, the first terminal is the first input terminal, and the second terminal is the second storage node.

4. A static random access memory cell according to claim 1, wherein the auxiliary circuit comprises:

a pass node;

a third pass transistor electrically connected between the first terminal and the pass node, and having an n-type conductivity and a third control terminal electrically connected to the column write wordline;

a fourth pass transistor electrically connected between the pass node and the single bitline, and having an n-type conductivity and a fourth control terminal electrically connected to the row wordline; and a read buffer transistor electrically connected between the pass node and the virtual common line, and having an n-type conductivity and a fifth control terminal electrically connected to the first terminal.

5. A static random access memory cell according to claim 4, wherein:

each of the third pass, the fourth pass and the read buffer transistors has a property associated with a reverse short channel effect;

each of the first, the second, the third and the fourth pass transistors has a first respective threshold voltage;

the bi-inverting circuit includes four transistors; and each of the read buffer transistor and the four transistors of the bi-inverting circuit has a second respective threshold voltage higher than the first respective threshold voltage.

6. A static random access memory cell according to claim 4, wherein:

the static random access memory cell has a write-selected state and a read-selected state;

when the static random access memory cell is in the write-selected state, the first and the second pass transistors are turned off for turning off the switching circuit and the third and the fourth pass transistors are turned on for writing the first data bit on the single bitline to the latch unit;

when the switching circuit is turned on, the bi-inverting circuit holds the first data bit; and when the static random access memory cell is in the read-selected state, the first, the second and the fourth pass transistors are turned on and the third pass transistor is turned off for reading the first data bit in the latch unit under a condition that the single bitline is decoupled with the first terminal.

7. A static random access memory cell according to claim 1, being arranged in a static random access memory array, wherein the static random access memory array utilizes the column write wordline to form a bit-interleaving structure.

8. A method of operating a static random access memory cell including a bi-inverting circuit and a switching circuit, wherein the bi-inverting circuit has a first terminal and a second terminal, the switching circuit is electrically connected between the first terminal and the second terminal and includes a first pass transistor and a second pass transistor, the first pass transistor is connected with the bi-inverting circuit in parallel and has a p-type conductivity, and the second pass transistor is connected with the first pass transistor in parallel and has an n-type conductivity, the method comprising steps of:

causing the static random access memory cell to have a hold state, a read-selected state, a write-selected state, a read-half-selected state, a first write-half-selected state and a second write-half-selected state respectively in different periods by controlling the first and the second pass transistors;

establishing a feedback between the first terminal and the second terminal for latching the bi-inverting circuit when the static random access memory cell is configured in one selected from a group consisting of the hold, the read-selected, the read-half-selected, the first write-half-selected and the second write-half-selected states; and removing the feedback for loading a first data bit into the bi-inverting circuit when the static random access memory cell is configured in the write-selected state.

9. A method according to claim 8, wherein the static random access memory cell is a subthreshold circuit, and has a single read/write port.

10. A method according to claim 8, wherein the static random access memory cell further includes a latch unit including the bi-inverting circuit and the switching circuit, and the bi-inverting circuit includes:

a first inverter having a first input terminal and a first storage node; and a second inverter having a second storage node and a second input terminal electrically connected to the first storage node, wherein the feedback is a positive feedback, the first terminal is the first input terminal, and the second terminal is the second storage node.

11. A method according to claim 8, wherein the static random access memory cell further includes:

a column write wordline electrically connected to the first control terminal, and receiving a first signal; and a row write-bar wordline electrically connected to the second control terminal, and receiving a second signal.

12. A method according to claim 11, further comprising a step of causing the latch unit to be applied to the hold, the read-selected, the write-selected, the read-half-selected, the first write-half-selected and the second write-half-selected states respectively in the different periods by means that the first and the second pass transistors respectively respond to the first and the second signals.

13. A static random access memory cell, comprising:
a latch unit including:
    a bi-inverting circuit having a first terminal and a second terminal; and
    a switching circuit electrically connected between the first terminal and the second terminal for forming a first connection state therebetween, including a first pass transistor and a second pass transistor, and changing the first connection state into a second connection state in response to an input signal, wherein the first pass transistor is connected with the bi-inverting circuit in parallel and has a first control terminal and a p-type conductivity, and the second pass transistor is connected with the first pass transistor in parallel and has a second control terminal and an n-type conductivity;
a row wordline;
a row write-bar wordline electrically connected to the second control terminal;
a virtual common line:
a single bitline:
a column write wordline electrically connected to the first control terminal; and
an auxiliary circuit electrically connected to the latch unit, the single bitline, the row wordline, the column write wordline and the virtual common line for controlling the latch unit.

14. A static random access memory cell according to claim 13, wherein:
the first connection state is a turn-off state, and the second connection state is a turn-on state;
when the first connection state is formed, the static random access memory cell loads a first data bit into the bi-inverting circuit; and
when the second connection state is formed, a feedback is formed between the first terminal and the second terminal for holding the first data bit in the bi-inverting circuit.

15. A static random access memory cell according to claim 13, wherein the first connection state is a turn-on state, and the second connection state is a turn-off state.

16. A static random access memory cell according to claim 15, wherein:
when the first connection state is formed, a feedback is formed between the first terminal and the second terminal and the bi-inverting circuit is latched through the feedback; and
when the second connection state is formed, the feedback is removed to cause the static random access memory cell to load a first data bit into the bi-inverting circuit.

* * * * *